United States Patent [19]

Kern

[11] 4,161,670

[45] Jul. 17, 1979

[54] CIRCUIT ARRANGEMENT FOR DRIVING PIEZOELECTRIC INK JET PRINTERS

[75] Inventor: Hans Kern, Munich, Fed. Rep. of Germany

[73] Assignee: Siemens Aktiengesellschaft, Berlin & Munich, Fed. Rep. of Germany

[21] Appl. No.: 721,951

[22] Filed: Sep. 10, 1976

[30] Foreign Application Priority Data

Oct. 30, 1975 [DE] Fed. Rep. of Germany ....... 2548691

[51] Int. Cl.[2] ............................................ H01L 41/10

[52] U.S. Cl. ................................ 310/317; 346/140 R

[58] Field of Search .................. 310/8.1, 8.2, 8.3, 316, 310/317, 323, 328, 330–332, 369, 371; 346/75, 140 R; 318/116, 118

[56] References Cited

U.S. PATENT DOCUMENTS

| | | | |
|---|---|---|---|
| 3,150,592 | 9/1964 | Stec | 310/371 X |
| 3,215,078 | 11/1965 | Stec | 310/371 X |
| 3,868,698 | 2/1975 | Dressler | 310/8.1 X |
| 3,902,083 | 8/1975 | Zoltan | 310/8.1 |
| 3,946,398 | 3/1976 | Kyser et al. | 310/332 X |
| 3,968,386 | 7/1976 | Heinzl | 310/8.1 |
| 4,034,380 | 7/1977 | Isayama | 310/328 X |

*Primary Examiner*—Mark O. Budd

*Attorney, Agent, or Firm*—Hill, Van Santen, Steadman, Chiara & Simpson

[57] ABSTRACT

The invention relates to a circuit arrangement for driving a plurality of printing jets in mosaic printers employing a plurality of tubular drive elements of polarized ceramic which hold printing liquid therein and whose diameter may be contracted or expanded by the application of suitably poled voltages thereto, in which activation of a jet takes place by the application of a pulse thereto comprising two half cycles of opposite polarity, the first cycle of which is operative to effect an expansion of the drive element from a normal rest condition, and the second is operative to effect a contraction of the drive element from its normal rest condition.

13 Claims, 4 Drawing Figures

CIRCUIT ARRANGEMENT FOR DRIVING PIEZOELECTRIC INK JET PRINTERS

BACKGROUND OF THE INVENTION

1. Field of the Invention

The present invention relates to a circuit arrangement for driving the printing jets in mosaic printers, employing tubular drive elements of polarized ceramic, which contain printing liquid and whose diameter reduces with the application of a voltage in the direction of the polarizing voltage and increases with the application of a voltage in opposition to the polarizing voltage.

2. Prior Art

German Offenlegungs-schrifts No. 2,144,892 discloses a pulsed droplet ejector device comprising a tubular piezoelectric component whose internal volume changes in response to electrical signals and in so doing ejects printing liquid contained in the tubular component. This piezoelectric transducer is driven in such a fashion that in the inoperative state it is in an expanded condition, as the result of the application of voltage thereto of a polarity opposite to the original polarizing voltage applied to the piezoceramic. To eject said printing liquid, an electronic switch system, e.g. a switching transistor is provided, by means of which the applied voltage is short-circuited, whereupon the transducer reacts with a sudden contraction and thus ejects a small quantity of liquid. After the ejection of a droplet, the transducer again has the original voltage applied to it and recycles to its expanded condition.

This kind of drive has the drawback that only a relatively small working stroke can be achieved with the piezoceramic because, due to the permanently applied control voltage which is in opposition to the original polarizing voltage, there is the risk of depolarizing the ceramic.

If, when using this kind of drive system, several jets are operated, then a separate voltage source must be provided for each printing jet and it is an expensive procedure to effect switching of voltages of this order.

SUMMARY OF THE INVENTION

The object of the present invention is to provide a drive system for the piezoelectric drive elements in ink-jet mosaic printers, by means of which it is possible, with the lowest possible drive voltages and optimum efficiency, to achieve a maximum stroke on the part of the piezoceramic. In using several printing jets, the drive system should be so contrived that short-circuiting of one jet does not lead to the breakdown of another. Also, for safety reasons, no voltage should be applied to the printing jets during pauses in printing and the voltage used for the printing operation should not be of a dangerous level.

In accordance with the invention this object is achieved in that to initiate the process of ejection of the ink-droplets, via the circuit arrangement the drive elements are expanded, from an inoperative rest condition, by the application of a voltage which is in opposition to the polarizing voltage, and this expanded state maintained for a determinate period of time; and in that in order to eject the ink-droplet the drive elements, via the circuit arrangements, are changed from an expanded state to a contracted state by a change in polarity of the controlled voltage used to produce the expanded state.

This type of driving of the drive elements has the major advantage that it is possible to achieve a very large stroke or travel in the ceramic tube, at the expense of relatively small voltage changes. Thus, the change in volume of the ceramic tube is at its peak in the neighborhood of the zero transit on the part of the operating voltage, and consequently the attainable speed of the pressure wave developed in the printing liquid by the volumetric changes, is also at its peak at this point.

Furthermore depolarization of the ceramic by the creation of an overvoltage, is virtually excluded because in the inoperative state of the ceramic the latter carries no voltage or, as in a special embodiment, carries a voltage of the same polarity as the polarizing voltage. This further increases the security of operation of the printer head.

Because, in order to produce ink-ejection, the ceramic tube is initially expanded by applying an opposing voltage and then contracted by reversing the voltage, ink transfer from a reservoir to the actual ejection tube is also brought about; when the ceramic tube is expanded a vacuum is developed in the ink, sucking it into the ink tube. The capillary forces acting at the exit orifice of the ink tube at the interface between air and ink, prevent air from entering the printing jet through this opening.

In a further advantageous embodiment, each drive element is assigned a voltage converter arrangement the secondary inductor in which, in association with the capacitance of the drive element, forms an oscillatory circuit which is unilaterally damped by a resistor and a diode arranged in series therewith. In this context, the amplitude of the control voltage applied to the drive elements is adjusted by limiting the primary spread in the voltage converter arrangement.

This circuit arrangement produces the requisite voltage characteristic for the driving of the ceramic tubes, in a simple and inexpensive manner. Also, in the event of the system being touched, the output voltage collapses to a non-lethal level and in the event of a short circuit, because of the current-limiting effect at the primary side, the circuit cannot be overloaded. The damping produced by the resistor and the diode, is unilaterally operative and therefore produces an ideal voltage characteristic for operation of the ceramic; the negative voltage rises very slowly until the tube is expanded, whereupon a rapid transition to positive voltage takes place in order to produce ejection, the voltage then decaying slowly until the tube is once again in the inoperative state. The best efficiency on the part of the arrangement is achieved if the resonance frequency of the oscillatory circuit constituted by the secondary inductance of the voltage converter arrangement and the capacitance of the piezoceramic, is equivalent to the resonance frequency of the liquid column enclosed in the ceramic tube and if the duration of the primary current pulse is equal to half the period of this resonance frequency.

If, in accordance with the proposal, several printing jets are combined to form a printer head and these jets driven using the arrangement in accordance with the invention, then it is possible in an advantageous manner to supply all the printing jets from just one voltage source, i.e. from just one, non-stabilized mains unit. Even so, short circuiting of a jet does not, thanks to the current-limiting action of the primary side, lead to the failure of the entire printer head.

DESCRIPTION OF THE PREFERRED EMBODIMENTS

Figure 1:
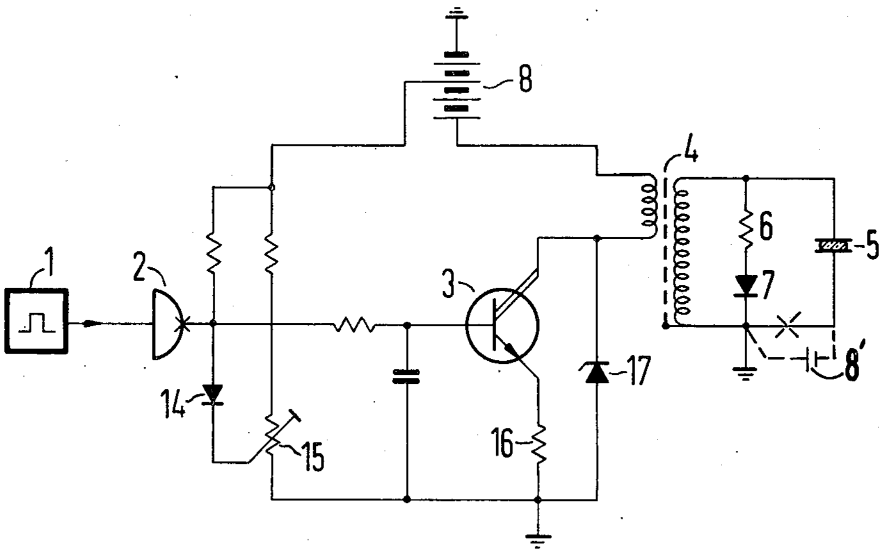
FIG. 1 is a schematic circuit diagram of an embodiment of a circuit arrangement for a printing jet in accordance with the principles of the invention.
Figure 2:
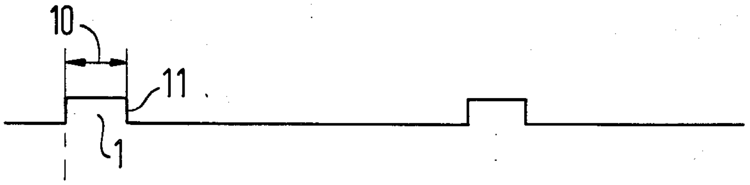
FIG. 2 is a graph depicting a form of the drive pulse for the circuit arrangement in accordance with the principles of the invention.

The circuit arrangement in accordance with the invention as best seen at FIG. 1, is driven by TTL-pulses 1 whose time-based characteristic has been illustrated in FIG. 2. These TTL-pulses are matched, via a driver stage 2, to the requisite voltage conditions for the circuit arrangement. Said driver stage is followed by an amplifier stage consisting of a transistor 3 in a Darlington circuit, which carries the primary winding of a pulse transformer 4. This pulse transformer 4 decouples the schematically illustrated printing jet 5 from the amplifier stage. The inductance of the secondary winding of the pulse transformer 4 taken in conjunction with the capacitance of the piezoceramic tube 5, forms an oscillatory circuit which is unilaterally damped by the series arrangement of a resistor 6 and a diode 7. The voltage applied to the overall circuit arrangement is effected from a common voltage source 8.

In operation, the transistor 3 in the Darlington arrangement, is driven conductive by a TTL pulse 1 of width 10 as best seen at FIG. 2, and matched by the driver stage 2. Current flows through the collector circuit and therefore the primary winding of the pulse transformer 4, inducing in the secondary winding thereof a voltage pulse which triggers the oscillatory circuit constituted by the secondary inductance of the pulse transformer 4 and the capacitance of the piezoceramic 5. With disconnection of the current at the end 11 of the TTL pulse, a voltage is induced in the opposite direction. This occurs at the instant of the first zero transit 13 in the oscillation, so that a pure, only slightly damped sinusoidal oscillation is produced whose amplitude depends upon the change in the primary current and the transformation ratio of the transformer 4. As described earlier this oscillation is unilaterally damped via the resistor 6 and the diode 7 in series therewith, so that on the ceramic a voltage characteristic corresponding to that shown in FIG. 3 is produced.

Figure 3:
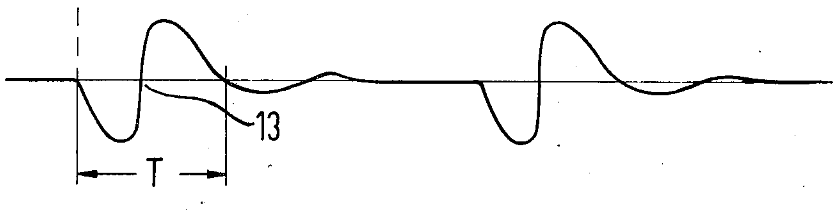
FIG. 3 is a graph depicting the wave form of a voltage applied to the printing jet.

The inductance of the secondary winding of the transformer 4 is so matched to the ceramic 5, that the oscillatory circuit acquires a natural frequency of about 10 KHz corresponding to a period T, as best seen at FIG. 3, on the part of the tuned oscillatory circuit, of around 60 $\mu$s.

In other words, the frequency corresponds to the resonance frequency of a liquid column enclosed by the tubular drive element. To achieve the optimum voltage characteristic on the ceramic 5, this oscillatory circuit is triggered, in the manner already described, by a current pulse, in the primary winding, of duration T/2 which corresponds to a time of about 30 $\mu$s.

The requisite working voltages on the individual ceramics are adjusted in the circuit arrangements by limiting the primary current of the pulse transformer 4. This limiting is achieved via the transistor 3 in the Darlington arrangement, and in fact the diode 14 limits the output voltage of the driver 2 to the value adjusted by a voltage-divider 15. The control voltage for the transistor 3 can thus be adjusted to between zero and about 8 volts and with application of the control voltage the transistor 3 is driven conductive. The emitter current in the transistor, however, can rise only until the voltage drop on an emitter resistor 16 and the base-emitter voltage corresponds with the control voltage adjusted on the voltage-divider. In this way, the primary current in the pulse transformer 4 can be adjusted to between zero and two Amps, this corresponding to working voltages ranging from zero to about 800 $V_{ss}$.

While the operation above described involves a normal rest condition of the ceramic with no voltage applied, as previously mentioned, it may be desirable in some cases to apply a voltage to the ceramic in its rest condition, having the same polarity as the polarizing voltage.

Such voltage could, for example, be readily derived by the insertion of a suitably poled voltage source in series with the ceramic and associated inductance. Thus, as illustrated in broken lines in FIG. 1, a voltage source 8′ may be inserted in the oscillating circuit in place of the direct connection illustrated in solid lines, thereby providing additional protection against depolarization.

The relatively high voltage drop on the emitter resistor 16 has the effect that the primary current in the pulse transformer 4 is dependent only to a small extent upon the base-emitter voltage of the transistor 3 in the Darlington arrangement. Accordingly, the working voltage on the ceramic 5 is maintained adequately constant in the presence of temperature fluctuations.

A Zener diode 17 connected in parallel with the collector-emitter circuit acts as a shunt which intercepts the voltage surges created with disconnection of the primary inductance of the pulse transformer 4, and protects the transistor 3 against surge voltage damage.

Figure 4:
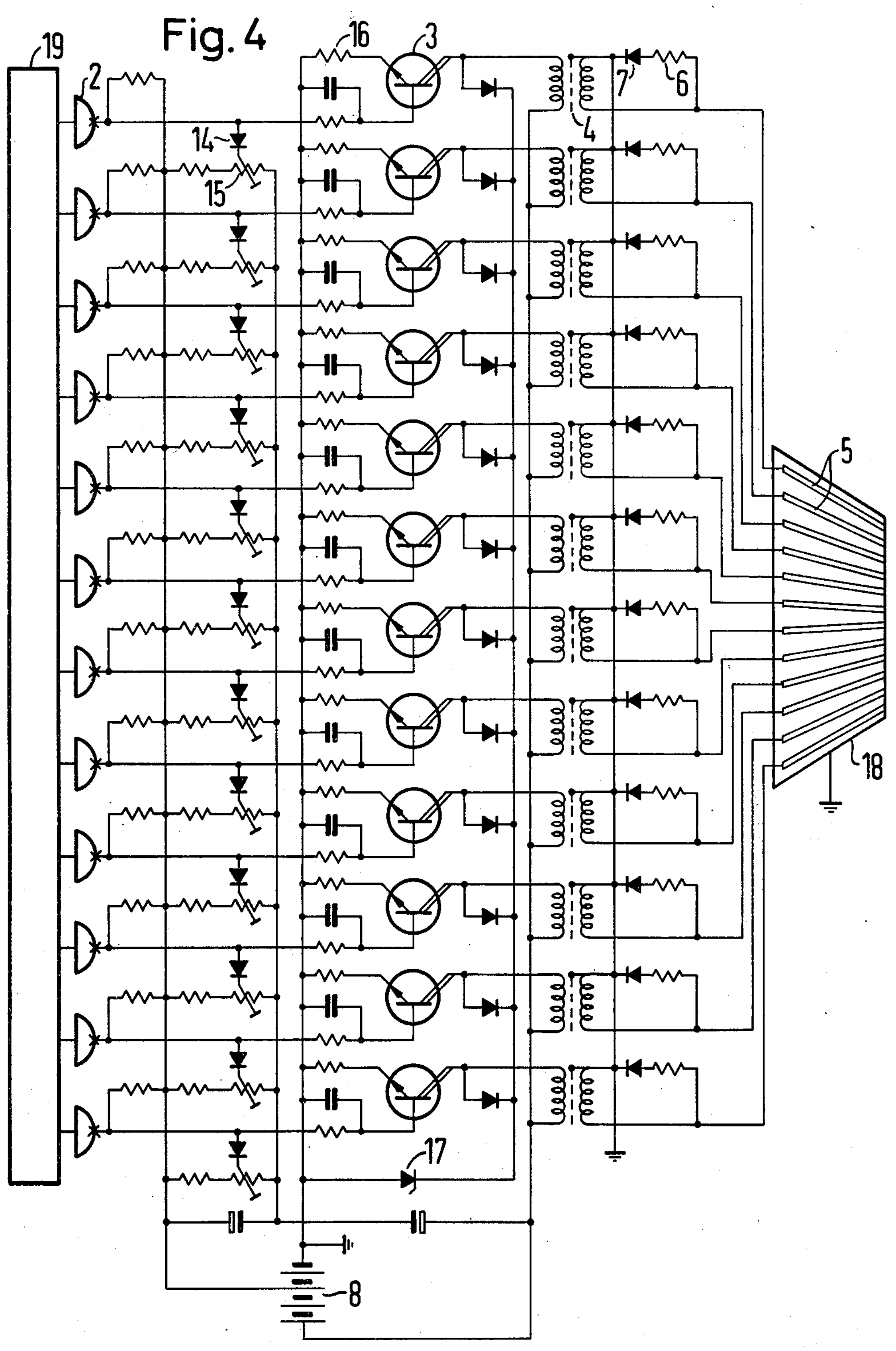
FIG. 4 is a schematic circuit diagram of an embodiment of the circuit arrangement for several printing jets in accordance with the principles of the invention.

The circuit for a ceramic jet, shown in FIG. 1, can be enlarged in a simple fashion to cope with a printer head 18, as best seen at FIG. 4 comprising several printing jets 5 in the manner proposed earlier. To this end, as shown in FIG. 4, each individual printing jet 5 is assigned a circuit arrangement of this kind and the individual printing jets are driven in a manner known per se through a common character generator 19, in a similar fashion to that which takes place in a mosaic printer.

All the printing jets can advantageously be supplied from a single voltage source 8. Through the current-limiting taking place at the primary side of the individual voltage converter arrangements, the result is also achieved that short-circuiting of one jet does not cause the failure of the entire system.

The circuit arrangement in accordance with the invention has the major advantage that in this way a voltage characteristic can be developed on the piezoceramic jets, which exploits the peak efficiency of the ceramic because the volumetric change in the ceramic tube 5 is at a peak in the neighborhood of the zero transit of the voltage. As the voltage opposing the polarizing voltage on the ceramic, is applied for only a short time; depolarizing of the ceramic is virtually excluded. Also, due to the simple reversing of the control voltage, the same volumetric change which is possible in the present state of the art, can be achieved with only half the control voltage. The entire arrangement is safe to touch as the output voltage on the printing jets is at a non-lethal level when any touch contact would be made, and in the event of a short-circuit in a single printing jet, no circuit overload is possible. Furthermore, a failure in one printing jet does not result in the simultaneous failure of all the others.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the following claims.

I claim as my invention:

1. In a circuit arrangement for driving at least one printing jet in mosaic printers, in the form of a tubular drive element of polarized ceramic, which contains printing liquid and whose diameter reduces with the application of a voltage in the direction of the polarizing voltage and increases with the application of a voltage in opposition to the polarizing voltage, the combination of means operatively connected to said ceramic for supplying thereto a voltage pulse comprising two directly following half cycles of opposite polarity, the second half cycle of which is of a polarity to polarize said ceramic and the first half cycle of which is of opposite polarity, and means, responsive upon selection of such printing jet, to trigger said pulse-supplying means, whereby the first half cycle of the supplied pulse is operable to initially effect expansion of said drive element from its normal rest condition, for effecting an ink flow into said drive element to fill the latter in its expanded state, and the second half of the supplied pulse is operable to effect an immediately following contraction of said drive element beyond its normal rest condition to apply pressure upon the ink in the expanded drive element, which pressure is reactive on the incoming ink flow produced by the initial expansion of the drive element, with the effective working stroke being derived from both half cycles and thus comprising the difference between such expanded and contracted conditions.

2. An arrangement according to claim 1, wherein said pulse supplying means comprises the sole voltage supply means to said drive element, whereby no voltage is applied to said element intermediate the application of said pulses thereto.

3. An arrangement according to claim 1, wherein said pulse supplying means includes an inductance which with the capacitance of the drive element forms an oscillatory circuit.

4. An arrangement according to claim 1, comprising means for applying to said drive element, intermediate the supply of pulses thereto, a voltage poled in the same direction as the polarizing voltage.

5. In a circuit arrangement for driving at least one printing jet in mosaic printers, in the form of a tubular drive element of polarized ceramic, which contains printing liquid and whose diameter reduces with the application of a voltage in the direction of the polarizing voltage and increases with the application of a voltage in opposition to the polarizing voltage, the combination of means operatively connected to said ceramic for supplying thereto a voltage pulse, said pulse supplying means comprising the sole voltage supply means to said drive element, whereby no voltage is applied to said element intermediate the application of said pulses thereto, said voltage pulse comprising two half cycles of opposite polarity, the second half of which is of a polarity to polarize said ceramic and the first half cycle of which is of opposite polarity, said pulse-supplying means including an inductance which with the capacitance of the drive element forms an oscillatory circuit, dampening means connected to said oscillatory circuit, and means, responsive upon selection of such printing jet, to trigger said pulse-supplying means, whereby the first half cycle of the supplied pulse is operable to initially effect expansion of said drive element from its normal rest condition, and the second half of the supplied pulse is operable to effect an immediately following contraction of said drive element beyond its normal rest condition, with the effective working stroke thus comprising the difference between such expanded and contracted conditions.

6. An arrangement according to claim 5, wherein said damping means comprises a series-connected resistance and diode.

7. In a circuit arrangement for driving at least one printing jet in mosaic printers, in the form of a tubular drive element of polarized ceramic which contains printing liquid and whose diameter reduces with the application of a voltage in the direction of the polarizing voltage and increases with the application of a voltage in opposition to the polarizing voltage, the combination of means operatively connected to said ceramic for supplying thereto a voltage pulse, said pulse supplying means comprising the sole voltage supply means to said drive element, whereby no voltage is applied to said element intermediate the application of said pulses thereto, said voltage pulse comprising two half cycles of opposite polarity, the second half of which is of a polarity to polarize said ceramic and the first half cycle of which is of opposite polarity, said pulse-supplying means including an inductance which with the capacitance of the drive element forms an oscillatory circuit, said inductance comprising a pulse transformer having a primary winding and a second winding, the secondary winding being operatively connected to said drive element and therewith forming said oscillatory circuit, and triggering means connected to said primary winding operative to supply a triggering pulse thereto, responsive upon selection of such printing jet, to trigger said pulse-supplying means, whereby the first half cycle of the supplied pulse is operable to initially effect expansion of said drive element from its normal rest condition, and the second half of the supplied pulse is operable to effect an immediately following contraction of said drive element beyond its normal rest condition, with the effective working stroke thus comprising the difference between such expanded and contracted conditions.

8. An arrangement according to claim 7, wherein the inductance of said secondary winding is so selected, with respect to the capacitance of the drive element, that such oscillatory circuit has a resonance frequency which corresponds to the resonance frequency of a liquid column enclosed by the tubular drive element, said triggering means being operative to supply a pulse to said primary winding having a duration equal to a half cycle of said resonance frequency.

9. An arrangement according to claim 8, wherein said pulse supplying means comprises the sole voltage supply means to said drive element, whereby no voltage is applied to said element intermediate the application of said pulses thereto.

10. An arrangement according to claim 8, comprising means for applying to said drive element, intermediate the supply of pulses thereto, a voltage poled in the same direction as the polarizing voltage.

11. An arrangement according to claim 7, comprising in further combination adjustable means for limiting the pulse circuit in said primary winding for controlling the amplitude of the control voltage applied to the drive element.

12. An arrangement according to claim 7, comprising in further combination, damping means shunting said secondary winding.

13. An arrangement according to claim 12, wherein said damping means comprises a series-connected resistance and diode.

* * * * *